(12) United States Patent
Bang et al.

(10) Patent No.: US 6,777,858 B2
(45) Date of Patent: Aug. 17, 2004

(54) CERAMIC PACKAGE FOR CRYSTAL OSCILLATOR

(75) Inventors: Shin Woong Bang, Suwon (KR); Se Young Seo, Seoul (KR); Hee Young Jun, Suwon (KR); Jong Pil Lee, Suwon (KR); Jong Tae Kim, Suwon (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 10/414,082

(22) Filed: Apr. 16, 2003

(65) Prior Publication Data

US 2004/0140856 A1 Jul. 22, 2004

(30) Foreign Application Priority Data

Jan. 21, 2003 (KR) .................................. 10-2003-3922

(51) Int. Cl.[7] ............................................. H01L 41/053
(52) U.S. Cl. ....................................................... 310/348
(58) Field of Search ........................... 331/108 D, 158; 310/348, 349

(56) References Cited

U.S. PATENT DOCUMENTS 6,452,311 B1 * 9/2002 Serizawa ..................... 310/363

FOREIGN PATENT DOCUMENTS

JP          2000-124765          4/2000

* cited by examiner

*Primary Examiner*—David Mis
(74) *Attorney, Agent, or Firm*—Lowe Hauptman Gilman & Berner LLP

(57) ABSTRACT

Disclosed is a ceramic package mounted with a crystal oscillator. The structure of the ceramic package is improved in order to reduce its size while minimizing thermal influence to a crystal wafer mounted on the ceramic package. The crystal oscillator ceramic package has a bottom sheet, a buffer sheet disposed on a periphery of the bottom sheet and having internal terminals on a top thereof, a crystal wafer mounted on the buffer sheet, a supporting sheet formed on a periphery of the buffer sheet and spaced from the internal terminal on the buffer sheet at a designated interval and a lib covering the supporting sheet for sealing a portion of the ceramic package for receiving the crystal wafer.

10 Claims, 6 Drawing Sheets

CERAMIC PACKAGE FOR CRYSTAL OSCILLATOR

BACKGROUND OF THE INVENTION

1. Field of the Invention

The present invention relates to a ceramic package mounted with a crystal oscillator functioning as a frequency generator and a frequency modulator. In particular, the structure of the ceramic package is improved in order to reduce its size while minimizing thermal influence to a crystal wafer mounted on the ceramic package.

2. Description of the Related Art

A crystal oscillator is generally used in various forms such as a frequency generator, a frequency modulator and a frequency converter. The crystal oscillator utilizes crystal having excellent piezoelectric characteristics, in which crystal functions as a stable mechanical vibrator.

Crystal is artificially grown in a high pressure autoclave, and cut along a crystal axis into pieces of various sizes and shapes. A crystal piece is formed into the shape of a wafer. The crystal wafer is necessarily formed to have a low phase noise, a high Q value and a low change rate of frequency according to time and environmental change.

The crystal wafer is fixed in a package and electrodes are formed on the crystal water for electrical connection so as to be used as a crystal oscillator. The crystal wafer is electrically connected to external electric devices and bonded to the package via conductive adhesive to this end, in which sufficient bonding areas are needed to obtain excellent vibration efficiency of the crystal oscillator and its reliability against external impact.

Sealing is provided to protect the crystal oscillator fixed to the package from external circumstances and contaminating substances. Since the operating efficiency of the crystal oscillator and its quality are greatly influenced by external environmental change and contamination, the crystal package is preferably so sealed to have a very low leak rate. To this end, a metallic lid-supporting sheet is bonded to a top of the ceramic package, and a lid made of the same material as the lid-supporting sheet is placed on the lid-supporting sheet and sealed thereto via electric welding. It is important that ceramic-to-metal and metal-to-metal bonding areas are airtight since external contaminating substances penetrated into the package may deteriorate several characteristics of the crystal oscillator such as reliability.

Peripheral devices are getting rapidly reduced in their sizes as personal portable terminals and radio apparatuses are miniaturized owing to ongoing development of mobile and radio communication apparatuses. On the other hand, the capacity of the crystal oscillator is enlarged, compared to those of the peripheral devices. Spatial restraints against the crystal oscillator are increased since electrical and mechanical connection of the crystal oscillator to the outside is restricted and miniaturization of the crystal wafer is limited. In particular, a crystal oscillator mounted on a temperature compensated crystal oscillator or TCXO package increases overall volume, and thus miniaturization of this crystal oscillator is getting more necessary. Accordingly, the art growingly requires a technique for miniaturizing the crystal oscillator and reducing its size.

FIG. 1A and FIG. 1B are sectional and plan views of a conventional ceramic package for a crystal oscillator. In FIGS. 1A and 1B, the crystal oscillator ceramic package comprises a bottom sheet 11 constituting a bottom of the package and a buffer sheet 12 disposed on the bottom sheet 11 for supporting a crystal wafer 16. The package also comprises an insulating sheet 13 on the buffer sheet 12 for obtaining a vibration space of the crystal oscillator as well as insulating the buffer sheet 12. The bottom sheet 11, the buffer sheet 12 and the insulating sheet 13 are commonly made of ceramic. Electrodes 18 are applied to a top of the buffer sheet 12 for electric connection of the crystal oscillator. The buffer sheet 12 serves to ensure stable oscillation of the crystal and protect the crystal wafer from external impact, and the electrodes function to connect between the crystal wafer and external terminals. The crystal wafer 16 is attached to the electrodes 18 of the buffer sheet 12 via conductive adhesive 19 and electrically connected to the same. A lid-supporting sheet 14 is formed on a top of the insulating sheet 13 to function as a cover of the ceramic package, and a lid 15 is formed on the lid-supporting sheet 14 for insulation of the ceramic package.

Since the conventional crystal oscillator ceramic package shown in FIGS. 1A and 1B comprises total five sheets from the bottom sheet to the uppermost lid, it is difficult to reduce the size of the ceramic package. Accordingly, the art has studied another crystal oscillator ceramic package with a structure improved over that of the above-described ceramic package.

FIG. 2 is a sectional view of another conventional ceramic package for a crystal oscillator. Referring to FIG. 2, buffer sheets 22 and 22' are formed on a bottom sheet 21 in the form of W or Mo deposited films at a thickness of about 10 $\mu$m. A top of the buffer sheet 22 is plated with metal such as Au, and a crystal wafer 26 is attached on the buffer sheet 22 via conductive adhesive 29. An insulating sheet 23 is disposed around a top of the bottom sheet 21 to form a wall, and a supporting sheet 24 is formed on the insulating sheet 23 for supporting a lid 25. The insulating sheet 23 is made of insulating ceramic to function as an insulator between the buffer sheet 22 and the supporting sheet 24, and the supporting sheet 24 is made of a metallic material substantially identical with the lid 25.

The crystal oscillator ceramic package having the structure shown in FIG. 2 is reduced in the number of laminated sheets compared to the conventional ceramic package shown in FIGS. 1A and 1B. However, the bottom sheet is formed thicker than that of the ceramic package in FIGS. 1A and 1B. That is, since the thin buffer sheet is disposed on the bottom sheet and the crystal is attached on the buffer sheet, the bottom sheet is necessarily formed thick to protect the crystal from external impact or fracture, thereby causing difficulty in forming a ceramic package. Also, the thin buffer sheet affords poor stability to the crystal against external impact.

FIG. 3 is a sectional view of further another conventional ceramic package for a crystal oscillator disclosed in a Japanese Laid-Open Patent Application Serial No. 2000-124765, which pertains to a crystal oscillator and a fabricating process thereof. Referring to FIG. 3, the crystal oscillator comprises a crystal wafer 36 having electrodes, a supporting portion 22 for supporting the crystal wafer 36, a first substrate 31 having conductor means for electrically connecting between the electrodes of the crystal wafer 36 and an external circuit, a second substrate 35 functioning as a cover and an insulating sheet 23 forming a side wall to enclose the crystal wafer 36. The crystal oscillator also comprises glass balls 24 in the insulating sheet 23.

In the crystal oscillator ceramic package shown in FIG. 3, the insulating sheet 23 is made of resin and melted to seal the package. Because the insulating sheet 23 made of resin may not uniformly maintain its height when it is melted, the glass balls 24 are previously disposed around the first substrate 31 before the insulating sheet 23 is melted in order tQ maintain the height of the insulating sheet 23. The glass balls 24 are inevitably used in such a structure, thereby disadvantageously increasing the manufacturing cost of an article. Melting the insulating sheet 23 produces gas or fume to contaminate the crystal wafer or an inner region of the package thereby deteriorating the quality and reliability of the article.

SUMMARY OF THE INVENTION

The present invention has been made to solve the foregoing problems and it is therefore an object of the present invention to improve the structure of a ceramic package for a crystal oscillator in order to further miniaturize the ceramic package.

It is another object of the invention to reduce the area of an electrode contacting with a crystal in order to decrease the floating capacitance of a crystal container. Also the invention reduces the number of ceramic sheets of a package to reduce heat capacity thereby saving welding power for sealing a lid functioning as a cover while reducing the influence of heat from welding to the crystal.

It is yet another object of the invention to provide a miniaturized ceramic package which can reduce overall flection while obtaining sufficient strength.

According to an aspect of the invention to obtain the above objects, a ceramic package for a crystal oscillator comprises: a bottom sheet having an external terminal; a buffer sheet disposed on a periphery of the bottom sheet and having an internal terminal on a top thereof, the internal terminal being electrically connected to the external terminal in the bottom sheet; a crystal wafer vibratably mounted on the buffer sheet and having an electrode electrically connected to the internal terminal on the buffer sheet; a supporting sheet formed on a periphery of the buffer sheet and spaced from the internal terminal on the buffer sheet at a designated interval; and a lid covering the supporting sheet for sealing a portion of the ceramic package for receiving the crystal wafer.

Preferably, the supporting sheet and the lid are made of metal, and the ceramic package for a crystal oscillator of the invention may further comprise a W bonding layer between the bottom sheet and the buffer sheet for bonding the bottom and buffer sheets together.

Preferably, the crystal wafer is bonded to a top portion of the buffer sheet via conductive adhesive, wherein the internal terminal on the buffer sheet has a recess on a central portion thereof, whereby the conductive adhesive is applied about the recess. Also preferably, the ceramic package for a crystal oscillator of the invention may further comprise via holes in the bottom and buffer sheets for electrically connecting the external terminal in the bottom sheet to the internal terminal on the buffer sheet.

According to another aspect of the invention to obtain the above objects, a ceramic package for a crystal oscillator comprises: a bottom sheet having an external terminal in an underside thereof; a buffer sheet disposed on a periphery of the bottom sheet and having an internal terminal on a top thereof, the internal terminal being electrically connected to the external terminal in the bottom sheet; a crystal wafer vibratably mounted on the buffer sheet adjacent to the internal terminal via conductive adhesive and having an electrode electrically connected to the internal terminal on the buffer sheet; a supporting sheet formed on a periphery of the buffer sheet to expose a first lateral portion of the buffer sheet where the internal terminal is disposed and a second lateral portion of the buffer sheet opposite to the first lateral portion; and a lid covering the supporting sheet for sealing a portion of the ceramic package for receiving the crystal wafer, wherein the internal terminal on the buffer sheet is spaced from the supporting sheet at a designated interval.

Preferably, the ceramic package for a crystal oscillator of the invention further comprise a W bonding layer between the bottom sheet and the buffer sheet for bonding the bottom and buffer sheets together, wherein the internal terminal on the buffer sheet has a recess on a central portion thereof, whereby the conductive adhesive is applied about the recess. Preferably also, the ceramic package for a crystal oscillator of the invention further comprise via holes in the bottom and buffer sheets for electrically connecting the external terminal in the bottom sheet to the internal terminal on the buffer sheet.

BRIEF DESCRIPTION OF THE DRAWINGS

The above and other objects, features and advantages of the present invention will be more clearly understood from the following detailed description taken in conjunction with the accompanying drawings, in which:

FIG. 1A and FIG. 1B show a ceramic package for a crystal oscillator of the prior art, in which FIG. 1A is a side sectional view thereof, and FIG. 1B is a plan view thereof;

FIGS. 4A and 4B show a ceramic package for a crystal oscillator of the invention, in which FIG. 4A is a side sectional view thereof, and FIG. 4B is a plan view thereof;

DETAILED DESCRIPTION OF THE PREFERRED EMBODIMENT

Figure 4A:
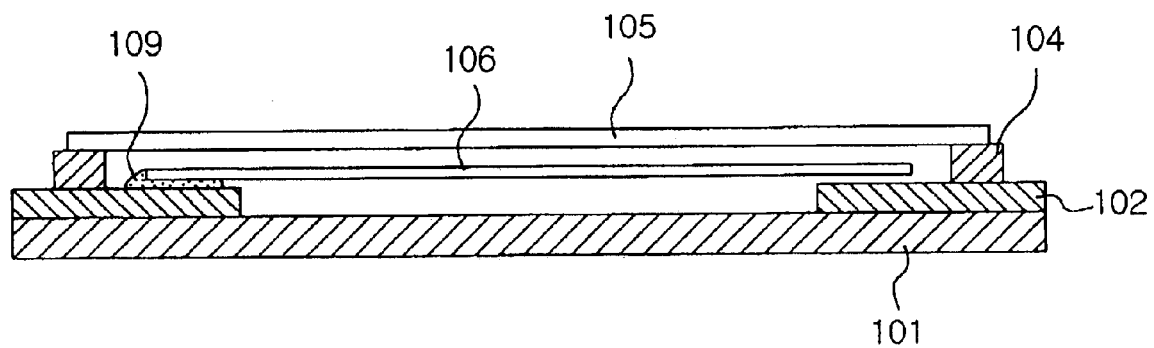
Figure 4B:
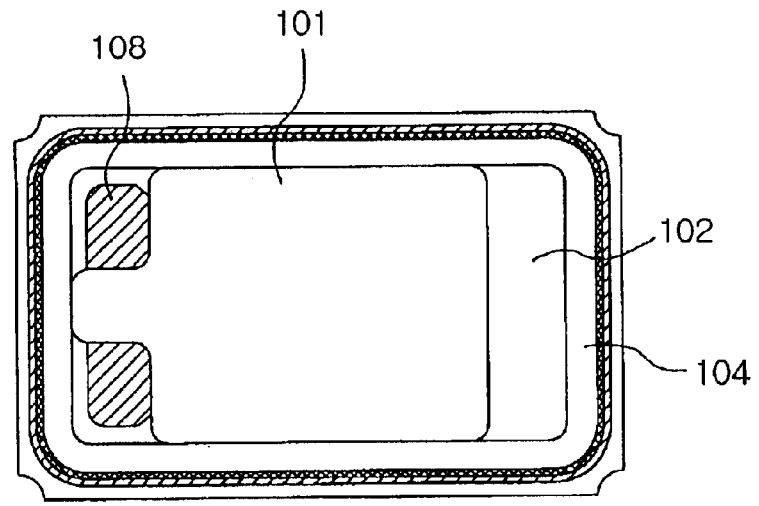

The following detailed description will present a preferred embodiment of the present invention in reference to the accompanying drawings. FIGS. 4A and 4B show a ceramic package for a crystal oscillator of the invention, in which FIG. 4A is a side sectional view thereof, and FIG. 4B is a plan view thereof.

The crystal oscillator ceramic package of the invention provides a structure which can reduce the number of laminated ceramic sheets compared to the prior art, thereby reducing the thickness of the entire package. For the purpose of this, the invention proposes a structure of eliminating the insulating sheet of the prior art, which is formed between the buffer sheet and the lid-supporting sheet. Hereinafter this structure of the invention will be described in more detail.

Referring to FIG. 4A, the ceramic package of the invention comprises a bottom sheet 101 disposed in the lowermost portion. The bottom sheet 101 is in the form of a ceramic substrate, and has external terminals on the underside thereof. The external terminals serve to provide power to a crystal wafer 106 mounted on the ceramic package, and via holes are formed in the bottom sheet 101 of the ceramic package in positions corresponding to the external terminals so that the external terminals are electrically connected to a top of the bottom sheet.

A buffer sheet 102 is disposed on the top of the bottom sheet 101. The buffer sheet 102 is laminated around the top of the bottom sheet 101, and internal terminals 108 are disposed on a top of the buffer sheet 102 for electrical connection to the external terminals in the bottom sheet 101. The buffer sheet 102 serves to support a crystal wafer 106 while protecting the crystal wafer 106 by absorbing external impact applied to the crystal wafer 106.

The buffer sheet 102 is made of ceramic as the bottom sheet 101. Since the buffer sheet 102 and the bottom sheet 101 are previously sintered solid ceramic, they are bonded together via a W bonding layer.

Since the W bonding layer is made of metal and placed between the ceramic sheets, beat may create overall flexural deformation to the crystal oscillator ceramic package owing to different thermal expansion coefficients of metal and ceramic.

The prior art has used a second insulating sheet forming another wall on the buffer layer and thus a second metallic bonding layer has been in use for interlayer bonding between the second insulating sheet and the buffer sheet. However, the invention can omit the second insulating sheet for interlayer bonding between the buffer sheet and the second metallic bonding layer. Since the ceramic package of the invention comprises only two ceramic sheets, only one metallic bonding layer can be used for interlayer bonding between the ceramic sheets, thereby reducing thermal deformation.

Figure 1A:
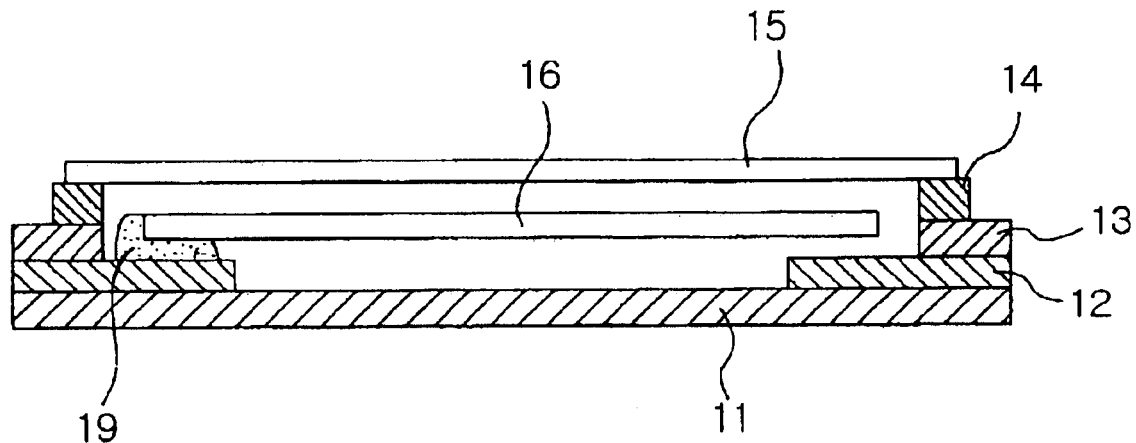
Figure 1B:
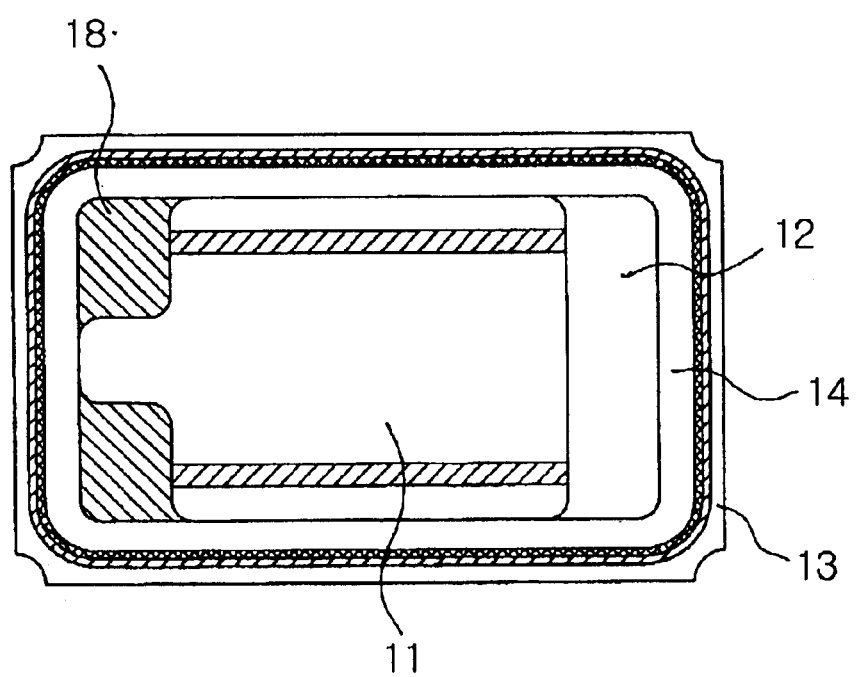
Figure 2:
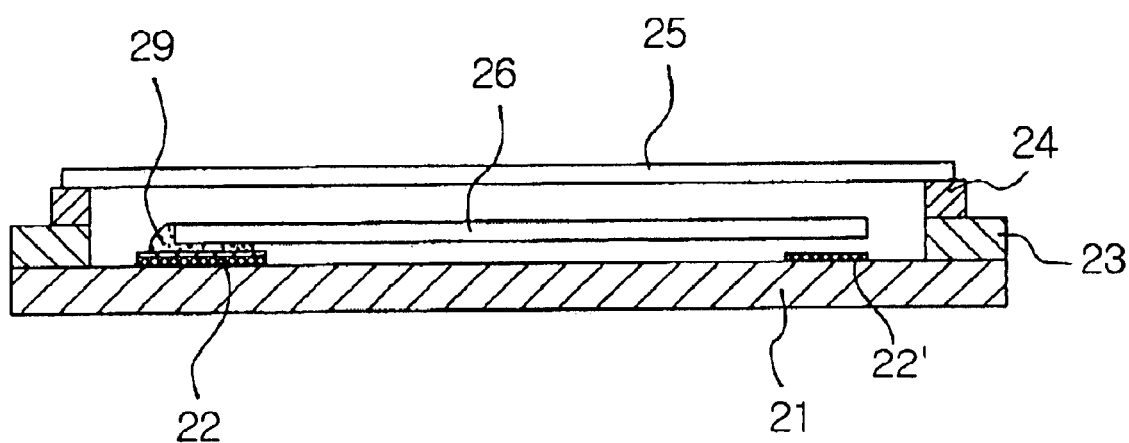
FIG. 2 is a side sectional view of another ceramic package for a crystal oscillator of the prior art.
Figure 3:
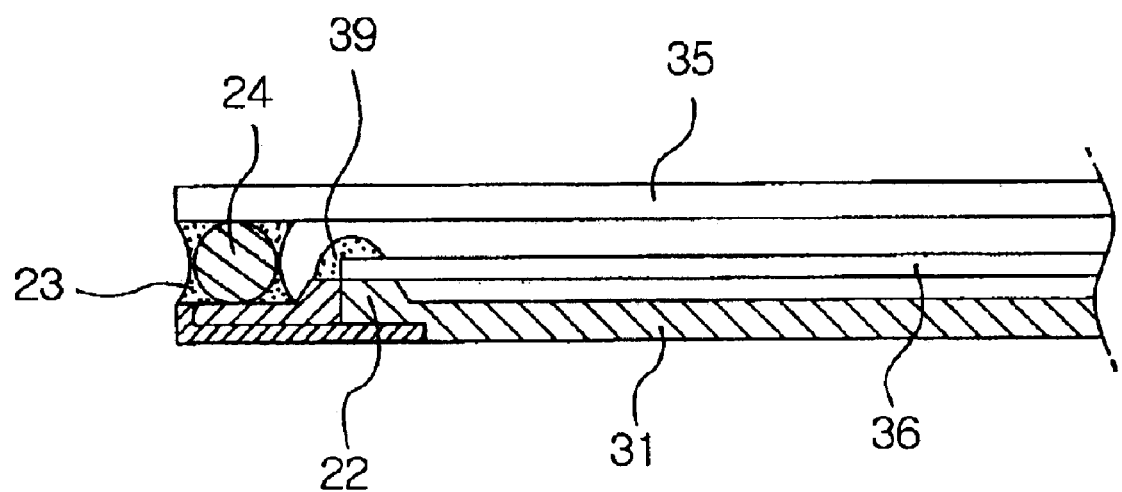
FIG. 3 is a side sectional view of further another ceramic package for a crystal oscillator of the prior art.

The buffer sheet 102 serves to ensure stable oscillation of the crystal wafer 106 while protecting the same from external impact. However, the conventional buffer sheet may insufficiently perform these functions if it is disposed thin on a central portion of the bottom sheet as shown in FIG. 2. Therefore, the invention adopts the structure which can omit the conventional insulating sheet while using the buffer sheet as it is.

The bottom sheet 101 of the invention has a height of about 0.13 mm and the buffer sheet 102 for fixing the crystal wafer 106 has a height of about 0.1 mm so that the bottom and buffer sheets 101 and 102 maintain an entire height of about 0.23 mm from the lowermost face of the ceramic package. This height is sufficient for the crystal wafer 106 to perform stable oscillation and for the bottom and buffer sheets to absorb impact applied to the crystal wafer 106.

The internal terminals 108 on the buffer sheet 102 of the invention are spaced apart from the supporting sheet 104 on the buffer sheet 102 at a designated interval. The supporting sheet 104 is formed on a periphery of the buffer sheet 102 and serves to support a lid 105. The lid 105 functions as a cover to maintain sealing of the crystal wafer 106 fixed to the buffer sheet 102.

The supporting sheet 104 is formed narrower than the buffer sheet 102 and made of metal since the lid 105 is made of metal. The lid 105 bonded to the supporting sheet 104 for sealing the ceramic package is made of a insulation-coated metal plate, in particular, which also has shielding effect and thus functions as a shield against noise. Since the lid 105 is laminated on the supporting sheet 104 via electric welding, the supporting sheet 104 is preferably made of the same metal as that of the lid.

The supporting sheet 104 is placed on the buffer sheet 102 but spaced apart from the internal terminals 108, which are also formed on the buffer sheet 102, at the designated interval so that the supporting sheet 104 does not contact with the internal terminals 108. Otherwise, short circuit may takes place between the metallic supporting sheet 104 and the metallic internal terminals. As a result, the supporting sheet 104 functions as a ground, thereby prohibiting oscillation of the crystal wafer 106. That is, the invention replaces the function of the conventional insulating sheet with the interval between the supporting sheet 104 and the internal terminals 108.

When the supporting sheet 104 is placed on the buffer sheet 102 as above, the internal terminals 108 on the buffer sheet 102 are spaced apart from the supporting sheet 104 at the designated interval. The entire area of the internal terminals 108 printed on the buffer sheet 102 only contacts with the crystal wafer 106. Then, as shown in FIG. 4B, the area of the internal terminals of the invention is reduced compared to the conventional terminals, thereby also decreasing a metal pattern area in the crystal oscillator ceramic package. This reduces the floating capacitance of a crystal container as well as its effect.

Both lateral portions of the buffer sheet 102 are projected beyond the supporting sheet 104 as shown in FIG. 4A, and the internal terminals 108 are formed in the left portion of the buffer sheet 102 in the drawing. The crystal wafer 106 is fixed over the buffer sheet 102 where the internal terminals 108 are formed, and thus not fixed over the buffer sheet 102 where the internal terminals are not formed. This structure is so provided to fix one end of the crystal wafer 106 while leaving the other end of the crystal wafer 106 to vibrate freely.

The crystal wafer 106 has electrodes which are electrically connected to the internal terminals 108 of the buffer sheet 102. The electrodes of the crystal wafer 106 are formed through vapor deposition of Au or Ag, and connected to the internal terminals 108 of the buffer sheet 102 via conductive adhesive 109.

Figure 5:
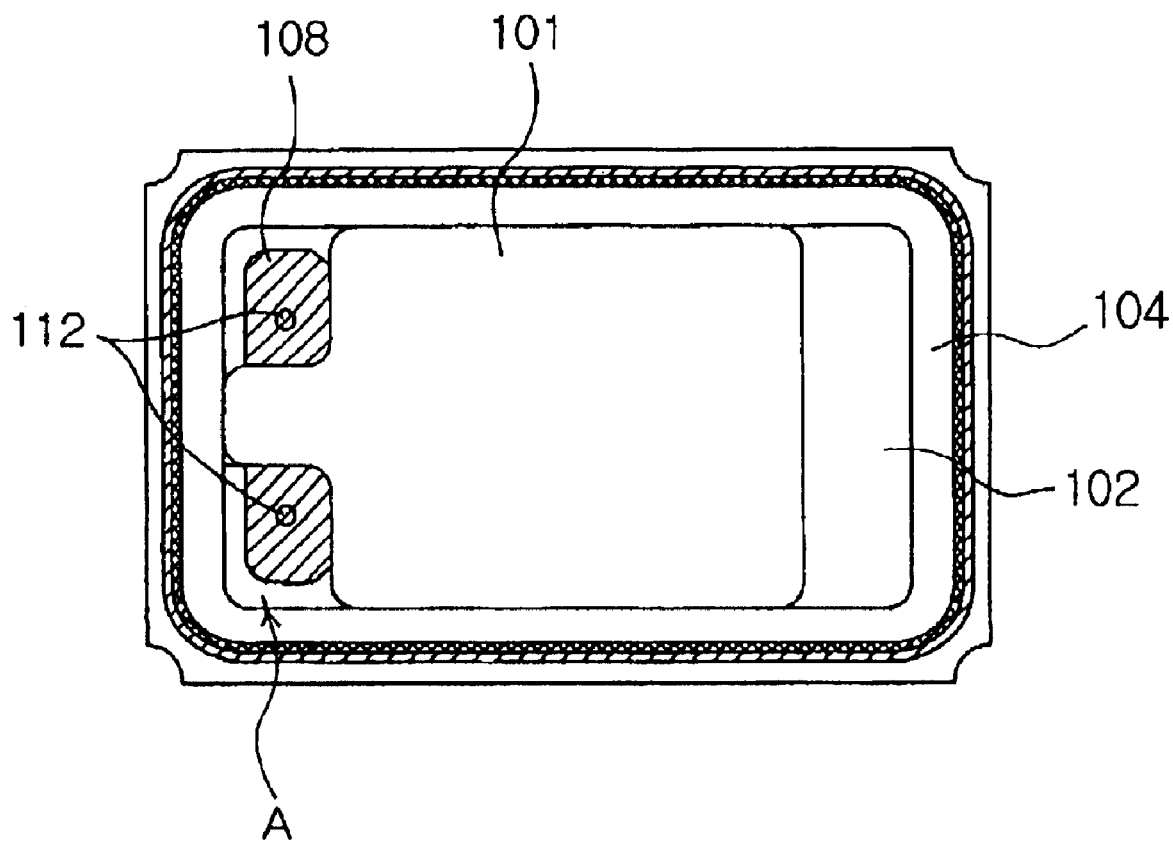
FIG. 5 is a plan view of insulating regions in a ceramic package according to an alternative embodiment of the invention.
Figure 6:
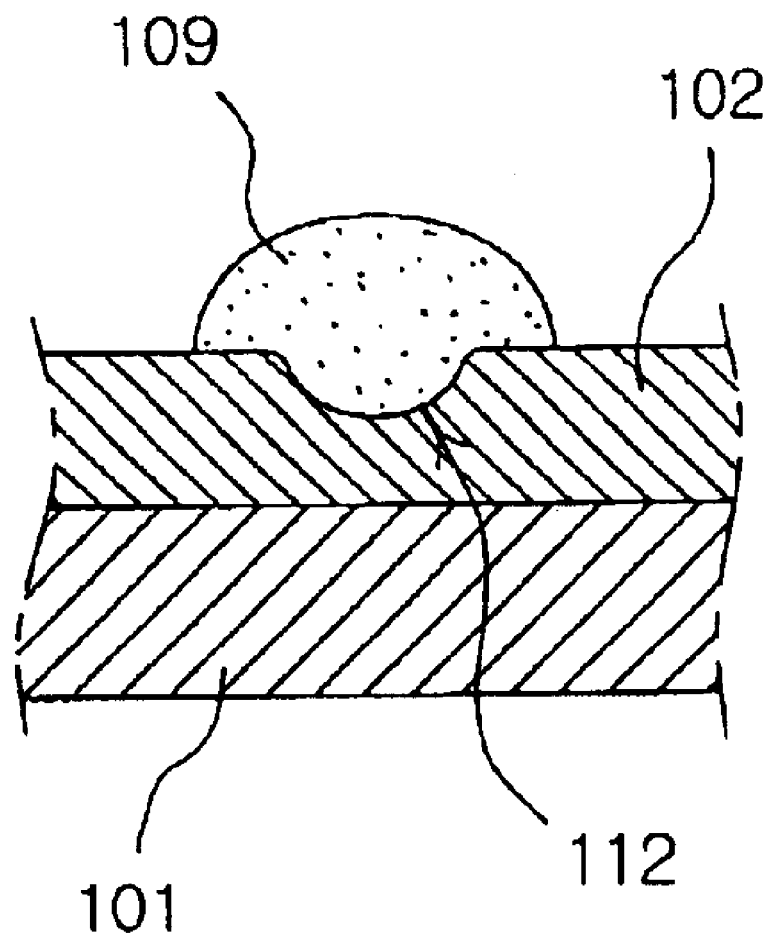
FIG. 6 is a sectional view of a recess in an internal terminal of the invention.

FIG. 5 is a plan view of insulating regions in a ceramic package according to an alternative embodiment of the invention. As shown in FIG. 5, internal terminals 108 have recesses 112 in their central portions. The recesses 112 are provided to correctly locate conductive adhesive 109 for fixing the crystal wafer 106 and to enhance the bonding strength between the internal terminals of the buffer sheet and the crystal wafer. Conductive adhesive 109 is filled into the recesses 112 to coat the internal terminals 108 as shown in FIG. 6. The recesses 112 configured as above allow conductive adhesive 109 to be more correctly applied on the internal terminals 108 so that the internal terminals 108 can be bonded to the crystal wafer 106 in position. Also, the recesses 112 can prevent conductive adhesive 109 from flowing into the interval between the internal terminals 108 and the supporting sheet 104, ensure sufficient conductive regions on the internal terminals 108 in the buffer sheet 102, and improve the conductivity and impact resistance of the crystal oscillator. Insulating regions A are formed between the supporting sheet 104 and the internal terminals 108 spaced from the supporting sheet 104 as shown in FIG. 5. The insulating regions A are formed on the surface of the buffer sheet 102 between the internal terminals 108 and the supporting sheet 104.

The lid 105 is attached on the supporting sheet 104 as sealing means. The lid 105 serves to maintain the sealed condition of an inner space of the ceramic package mounted with the crystal wafer 106. The inner space of the ceramic package for mounting the crystal wafer 106 is generally sealed and filled with inert gas functioning as non-oxidizing gas. This resultantly reduces thermal influence to the crystal wafer 106 inside the crystal oscillator as well as prevents corrosion inside the ceramic package.

The lid 105 is seam-welded to the supporting sheet 104 in a sealing fashion, in which edges of the lid 105 are welded with edges of the supporting sheet 104 which contact with the edges of the lid 105. In electric welding as above, the invention provides the two ceramic sheets, which are decreased in number compared to the three sheets of the prior art, to reduce the number of resistant sheets thereby advantageously saving power consumption necessary for welding.

Further, since the thickness of the ceramic sheets is reduced, heat transferred via welding can rapidly leak out of the ceramic package resultantly preventing thermal damage of the crystal wafer in the ceramic package.

In the ceramic package having the above structure of the invention, it is preferred that the external terminals of the bottom sheet 101 and the internal terminals 108 of the buffer sheets 102 are electrically connected to each other by via holes (not shown) in the bottom and buffer sheets 101 and 102.

According to the embodiments of the present invention, the height of the bottom sheet 101 is about 0.13 mm and the height of the buffer sheet 102 for fixing the crystal wafer 106 is about 0.1 mm. The total height of the supporting sheet 104 and the lid 105 can be set to about 0.2 mm. Unlike the conventional ceramic package which forms the insulating sheet, the structure of the invention provides the internal terminals 108 together with the insulating regions A on the buffer sheet 102.

As set forth above, the invention omits the ceramic insulating sheet while forming the insulating regions for insulating the internal terminals from the supporting sheets for supporting the lid, thereby further reducing the thickness of the crystal oscillator ceramic package.

The invention also reduces the area of the electrodes contacting with the crystal wafer to reduce the floating capacitance of the crystal container, and reduces the number of the ceramic sheets in the ceramic package to reduce heat capacity thereby saving power consumption in welding of the lid for sealing and protecting the crystal wafer from thermal influence in welding.

The invention also miniaturizes the ceramic package in which the number of the metallic bonding layers for bonding the ceramic sheets is reduced in order to reduce overall flexural deformation owing to the difference of thermal expansion as well as to ensure sufficient strength.

Although the preferred embodiments of the present invention have been disclosed for illustrative purposes, those skilled in the art will appreciate that various modifications, additions and substitutions can be made without departing from the scope and spirit of the invention as disclosed in the accompanying claims.

What is claimed is:

1. A ceramic package for a crystal oscillator comprising:
    a bottom sheet having an external terminal;
    a buffer sheet disposed on a periphery of the bottom sheet and having internal terminals on a top thereof, the internal terminals being electrically connected to the external terminal in the bottom sheet;
    a crystal wafer mounted on the buffer sheet, being capable of vibrating and having an electrode electrically connected to the internal terminal on the buffer sheet;
    a supporting sheet formed on a periphery of the buffer sheet and spaced apart from the internal terminal on the buffer sheet at a designated interval; and
    a lid placed on the supporting sheet for sealing a portion of the ceramic package for receiving the crystal wafer.

2. A ceramic package for a crystal oscillator as set forth in claim 1, wherein the supporting sheet and the lid are made of metal.

3. A ceramic package for a crystal oscillator as set forth in claim 1, further comprising a W bonding layer between the bottom sheet and the buffer sheet for bonding the bottom and buffer sheets together.

4. A ceramic package for a crystal oscillator as set forth in claim 1, wherein the crystal wafer is bonded to a top portion of the buffer sheet via conductive adhesive.

5. A ceramic package for a crystal oscillator as set forth in claim 4, wherein the internal terminals on the buffer sheet have at least one recesses on a central portion thereof, the conductive adhesive being applied in the recesses.

6. A ceramic package for a crystal oscillator as set forth in claim 1, further comprising via holes in the bottom and buffer sheets for electrically connecting the external terminal on the bottom sheet to the internal terminal on the buffer sheet.

7. A ceramic package for a crystal oscillator comprising:
    a bottom sheet having an external terminal on an underside thereof;
    a buffer sheet disposed on a periphery of the bottom sheet and having internal terminals on a top thereof, the internal terminals being electrically connected to the external terminal in the bottom sheet;
    a crystal wafer mounted on the internal terminals of buffer sheet via conductive adhesive, being capable of vibrating and having an electrode electrically connected to the internal terminals on the buffer sheet;
    a supporting sheet formed on a periphery of the buffer sheet to expose a first lateral portion of the buffer sheet where the internal terminals are disposed and a second lateral portion of the buffer sheet opposite to the first lateral portion; and
    a lid placed on the supporting sheet for sealing a portion of the ceramic package for receiving the crystal wafer,
    wherein the internal terminals on the buffer sheet are spaced apart from the supporting sheet at a designated interval.

8. A ceramic package for a crystal oscillator as set forth in claim 7, further comprising a W bonding layer between the bottom sheet and the buffer sheet for bonding the bottom and buffer sheets together.

9. A ceramic package for a crystal oscillator as set forth in claim 7, wherein the internal terminals on the buffer sheet have at least one recesses on a central portion thereof, the conductive adhesive being applied in the recesses.

10. A ceramic package for a crystal oscillator as set forth in claim 7, further comprising via holes in the bottom and buffer sheets for electrically connecting the external terminal on the bottom sheet to the internal terminal on the buffer sheet.

* * * * *